United States Patent [19]
Bohley

[11] Patent Number: 5,519,645
[45] Date of Patent: May 21, 1996

[54] DATA AVERAGING AND COMPRESSING METHOD FOR MEASURING INSTRUMENTS

[75] Inventor: Rolf Bohley, Reutlingen, Germany

[73] Assignee: Wandel & Goltermann GmbH & Co. Elektronische Messtechnik, Eningen u. A, Germany

[21] Appl. No.: 154,948

[22] Filed: Nov. 19, 1993

[30] Foreign Application Priority Data

Nov. 21, 1992 [DE] Germany .......................... 42 39 215.2

[51] Int. Cl.⁶ .................................................. G01R 19/04
[52] U.S. Cl. ........................... 364/575; 381/29; 364/485
[58] Field of Search ...................... 364/575–525, 364/557, 556, 573–574, 485; 381/29–30, 41

[56] References Cited

U.S. PATENT DOCUMENTS 4,190,886  2/1980  Sherman ................................. 364/574
4,794,324  12/1988  Tracey et al. .

FOREIGN PATENT DOCUMENTS 1548576  6/1966  Germany .
3817499C1  9/1989  Germany .

OTHER PUBLICATIONS

Nitsushin Denki K.K.; 59-70970 (A); Appl. No. 57-181831; Harmonic Analyzer Apr. 1984, abstract.

G. Kirsch: "Use of the Signal Averaging Technique in Magnetocardiography"; pp. 31–36, no translation.

*Primary Examiner*—Ellis B. Ramirez
*Assistant Examiner*—Craig Steven Miller
*Attorney, Agent, or Firm*—Herbert Dubno

[57] ABSTRACT

A method for data or measured value averaging and compression for measuring instruments, particularly for spectral analyzers, in which in successive measuring runs with respect to measuring intervals minimum and maximum values and their precise position are determined and used for averaging taking account of the values determined at the same locations during further measuring runs. By means of a measured value or data determination dependent on the position of the fixed minimum and maximum values, it is ensured that an effective noise averaging and a reliable detection of narrow pulses are made possible.

10 Claims, 3 Drawing Sheets

DATA AVERAGING AND COMPRESSING METHOD FOR MEASURING INSTRUMENTS

SPECIFICATION

1. Field of the Invention

The present invention relates to a method for the averaging and compression of data for measuring instruments and, more particularly, this invention relates to a data averaging and compression method especially for spectral analyzers in which the measured values determined as a first measured quantity over a measuring range subdivided into several measuring intervals are averaged and compressed.

2. Background of the Invention

Digital methods for data compression and averaging are known, but have either a limited averaging effect in the case of noise, or lead to an undesired suppression of narrow, discrete signals, e.g. when the frequency-dependent spectrum is measured by means of a spectrum analyzer.

3. Objects of the Invention

It is therefore an object of the present invention to provide a method of data averaging and compression for measuring instruments which is also usable for spectrum analyzers and which has a limited information loss during the compression and averaging.

SUMMARY OF THE INVENTION

According to the invention, this problem is solved by a data compression and averaging method wherein in several measuring runs from the values measured within a measuring interval a first value (MI1) at a first, given position is selected and a second value (MA1) at a second, also given position is selected. On the one hand the first measured values (MI1, MI2) and on the other hand the second measured values (MA1, MA2) of the same measuring intervals of successive measuring runs are averaged and the resulting mean values (MI2av, MA2av) are averaged with first measured values and with second measured values of the same measuring interval of at least one further measuring run.

Each measuring run is subdivided into several measuring intervals and each measuring interval is subdivided into several partial intervals, the partial intervals within a measuring interval being numbered and the number of a partial interval being designated the relative address thereof.

Within a measuring run a compression is carried out by deriving from each measuring interval only one first and one second measured value or data item; as well, one third and one fourth value, which are not measured values, are used for the further processing. In successive measuring runs a measured value or data averaging is continuously carried out, first data of the same measuring intervals being averaged together and second data of the same measuring intervals being averaged together to obtain mean values. The mean values are then used for averaging in further measuring runs, so that during the measurement method increasingly more accurate mean values are formed.

It is particularly advantageous in each measuring run to consider the number of the partial interval in which the minimum value has occurred as the third value (relative address AMI) and the measured value of the partial interval with the relative address AMI determined in the preceding measuring run as the first measured value. In the same way the number of the partial interval in which the maximum value has occurred is considered as the fourth value (relative address AMA) and the measured value of the partial interval with the relative address AMA determined in the preceding measuring run as the second measured value.

As in the first measuring run there are no relative addresses of a preceding measuring run, in this case the first measured value is constituted by the minimum value and the second measured value by the maximum value within a measuring interval.

In this way, an effective averaging is obtained with noise signals, where the minimum and maximum values occur at random points, while simultaneously the useful signals (deterministic signals) occurring at the same point can be accurately determined.

The method according to the invention fulfills the requirement of effective noise averaging and a correct representation of narrow, discrete signals at the same time. This is particularly advantageous when used in spectrum and distortion analyzers, used in communications measurement technology.

BRIEF DESCRIPTION OF THE DRAWING

The above and other objects, features and advantages of the invention will become more readily apparent from the following description, reference being made to the accompanying highly diagrammatic drawing in which.

SPECIFIC DESCRIPTION

The averaging method is suitable for measuring instruments, which measure a quantity Y as a function of a quantity X. For example, it is possible to measure as the quantity Y the amplitude (voltage) as a function of the frequency (quantity X). Between a start value X-start and a stop value X-stop the measuring range is subdivided into measuring intervals and during a measuring run with respect to each measuring interval measurement takes place of at least one first value MI and a second value MA.

In the represented embodiment each measuring interval is subdivided into 16 partial intervals (0 to 15), which consequently represents 16 possible positions for the measurements within a measuring interval.

Figure 1:
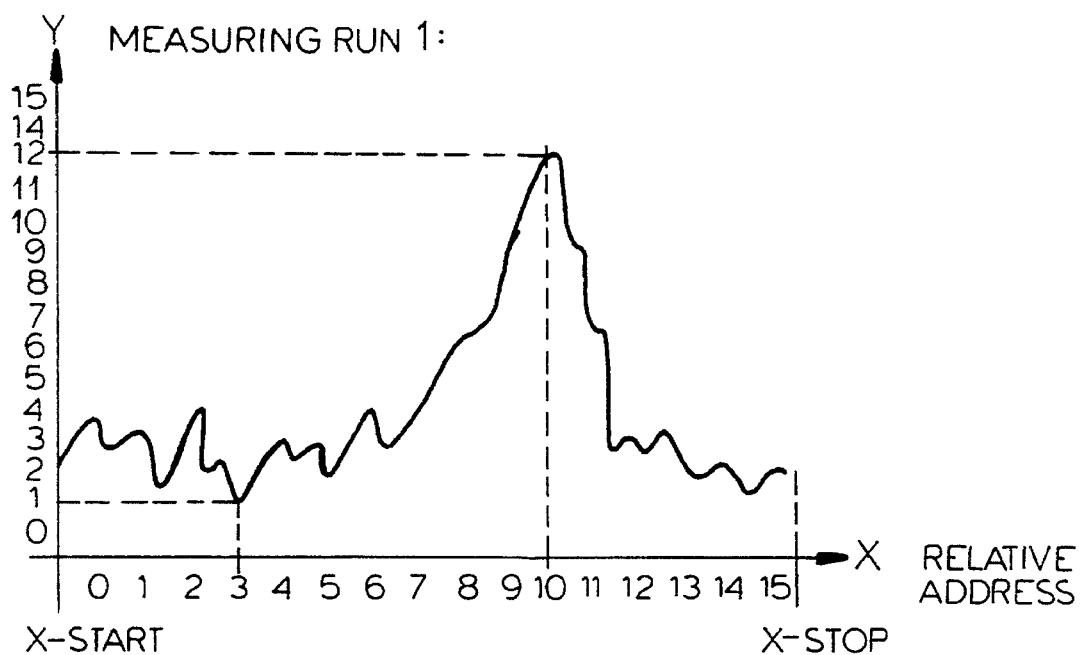
FIG. 1 is a graph of the characteristic signal curve within a measuring interval during a first measuring run.

The first measuring run shown in FIG. 1 contains in the measuring interval considered here at the partial interval 3 a minimum value MI1=1 (first value) and at the partial interval 10 a maximum value MA1=10 (second value). These values can be filed in a not shown memory together with the relative addresses AMI1=3 and AMA1=10.

In the second measuring run measurement takes place at the partial interval 3, which corresponds to the number of the relative address of the previously determined minimum, of a further first value MI2, which is averaged with the previous first value MI1, so that a new averaged first value MI2av is obtained. Simultaneously during the second measuring run it is established that there the minimum value is at the partial interval 14, so that from it can be retained a new relative address AMI2=14 for the next measuring run for measuring the next first value.

The same procedure is used in the second measuring run for averaging the second value. In the partial interval 10, the value MA2=11 is measured corresponding to the relative address AMA1 retained during the first measuring run and it is averaged with the previously determined second value MA1 from the first measuring run. In addition, a new relative address AMA2 is retained for the maximum, namely AMA2=10, because that is where the maximum is located during the second measuring run.

During the third measuring run (FIG. 3) measurement takes place at the retained relative addresses AMI2=14 and AMA2=10 and the established values are used for averaging. In addition, a new relative address is retained by means of the third measuring run for the minimum value AMI3=6, because during the third measuring run the minimum occurred at the partial interval 6. The relative address for the maximum is AMA3=10, as was the case in the two preceding measuring runs.

In a fourth measuring run (FIG. 4) measurement can again take place at the previously established relative addresses and averaging can take place.

Hereinafter the measurement, averaging and determination of the relative addresses during the measuring runs 1 to 4 are again represented in short form:

FIG. 1: First measuring run

It is assumed that initially no relative address is stored.

$MI1=1$ at $AMA1=3$ $MA1=12$ at $AMA1-10$

Figure 2:
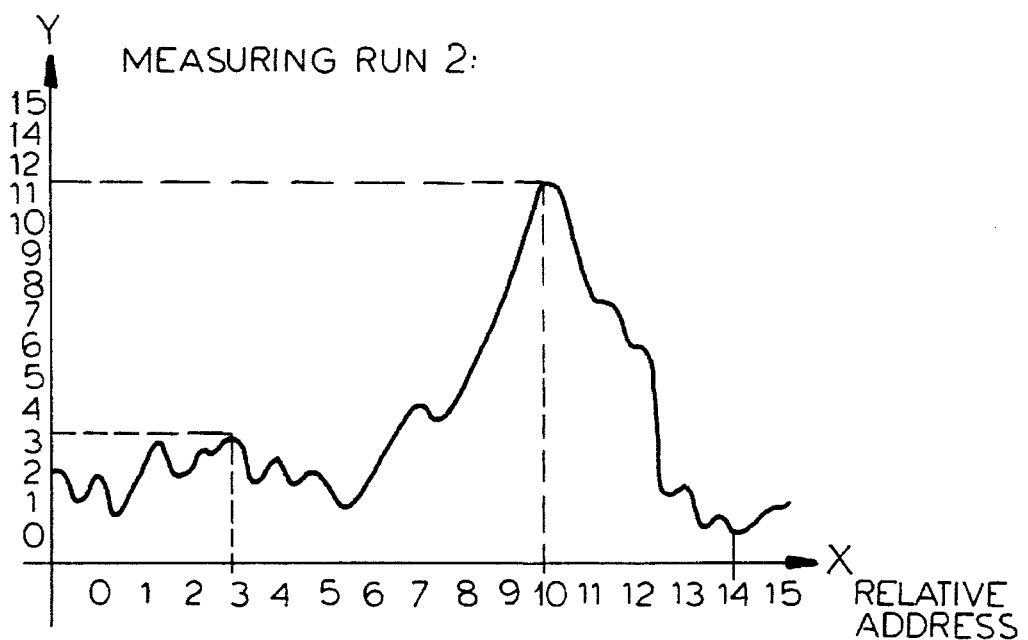
FIG. 2 is a graph of the characteristic signal curve within a measuring interval during a second measuring run.

FIG. 2.: Second measuring run

There are relative addresses AMI 1=3 and AMA 1=10.

Thus, initially at the address for the minimum value a further first value is measured, i.e.

$AMI1=3$ $MI2=3$, which gives the mean value $MI2\ av=\frac{1}{2}\ (MI1+MI2)=2$

The relative address for the maximum was AMA1=10 in the first measuring run, where now the new second value MA2=11 and from this is obtained the new mean value of the second value:

$MA2av=\frac{1}{2}\ (MA1+MA2)=11.5.$

In the second measuring run are determined as new relative addresses for the minimum value AMI2=14 and for the maximum value AMA2=10.

Figure 3:
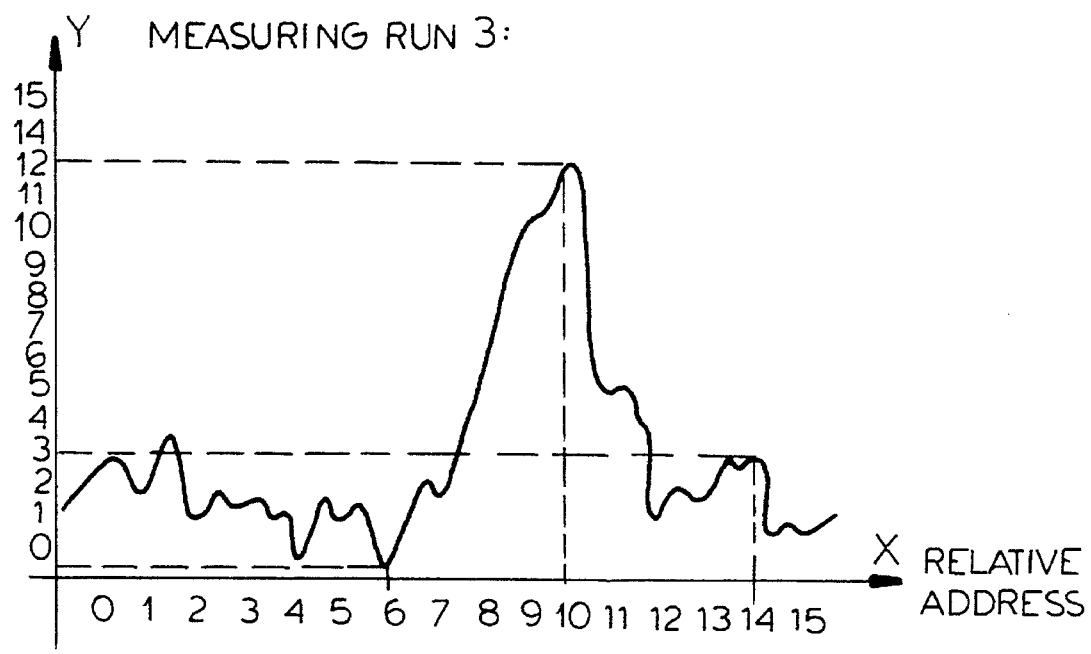
FIG. 3 is a graph of the characteristic signal curve within a measuring interval during a third measuring run.

FIG. 3: Third measuring run

In the same way as in the second measuring run, the following values are obtained:

| At AMI2 = 14 | MI3 = 3 |
|---|---|
| at AMA2 = 10 | MA3 = 12 |

For the mean values are obtained:

$MI3av=\frac{1}{2}\ (MI2av+MI3)=2.5$ $MA3av=\frac{1}{2}\ (MA2av+MA3)=11.75$

As the new relative addresses are obtained:

| AMI3 = 6 | AMA3 = 10 |
|---|---|

Figure 4:
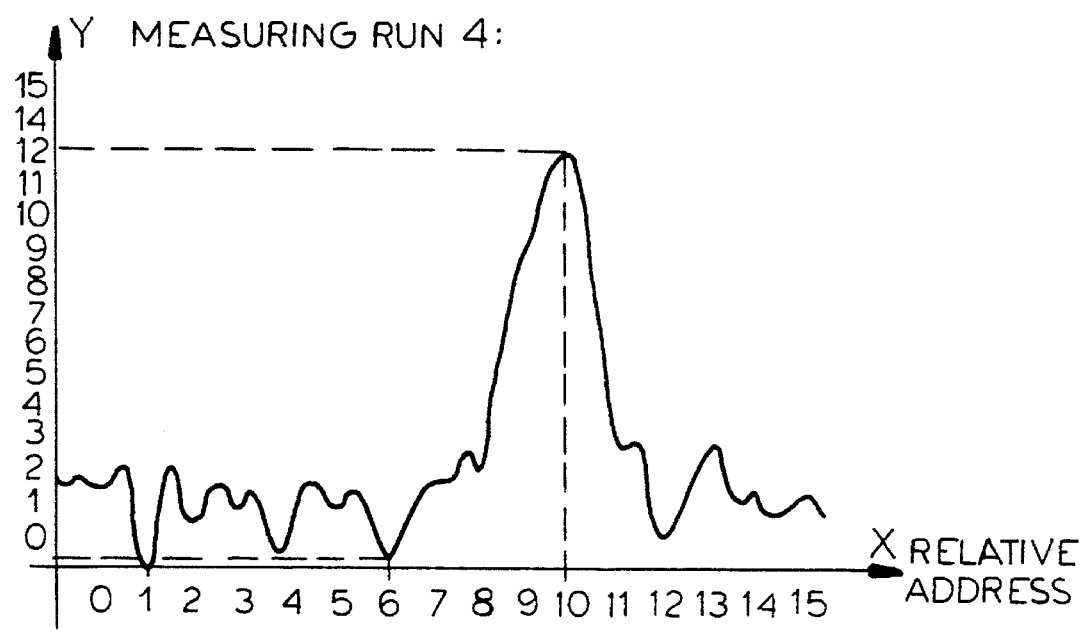
FIG. 4 is a graph of the characteristic signal curve within a measuring interval during a fourth measuring run.

FIG. 4: Fourth measuring run

In the same way as for the third measuring run, the following mean values are obtained:

$MI4av=\frac{1}{2}\ (2.5+MI4)=1.25$ $MA4av=\frac{1}{2}\ (11.75+MA4)=11.875$

In place of the presently described arithmetic averaging method, it is also possible to use any other known averaging method.

The signal of the frequency analyzer with data compressed and averaged as described, yields in relatively few measuring runs a highly accurate result for minimum and maximum of the analyzed spectrum even in the presence of considerable noise as is evident from the signals portrayed.

Figure 5:
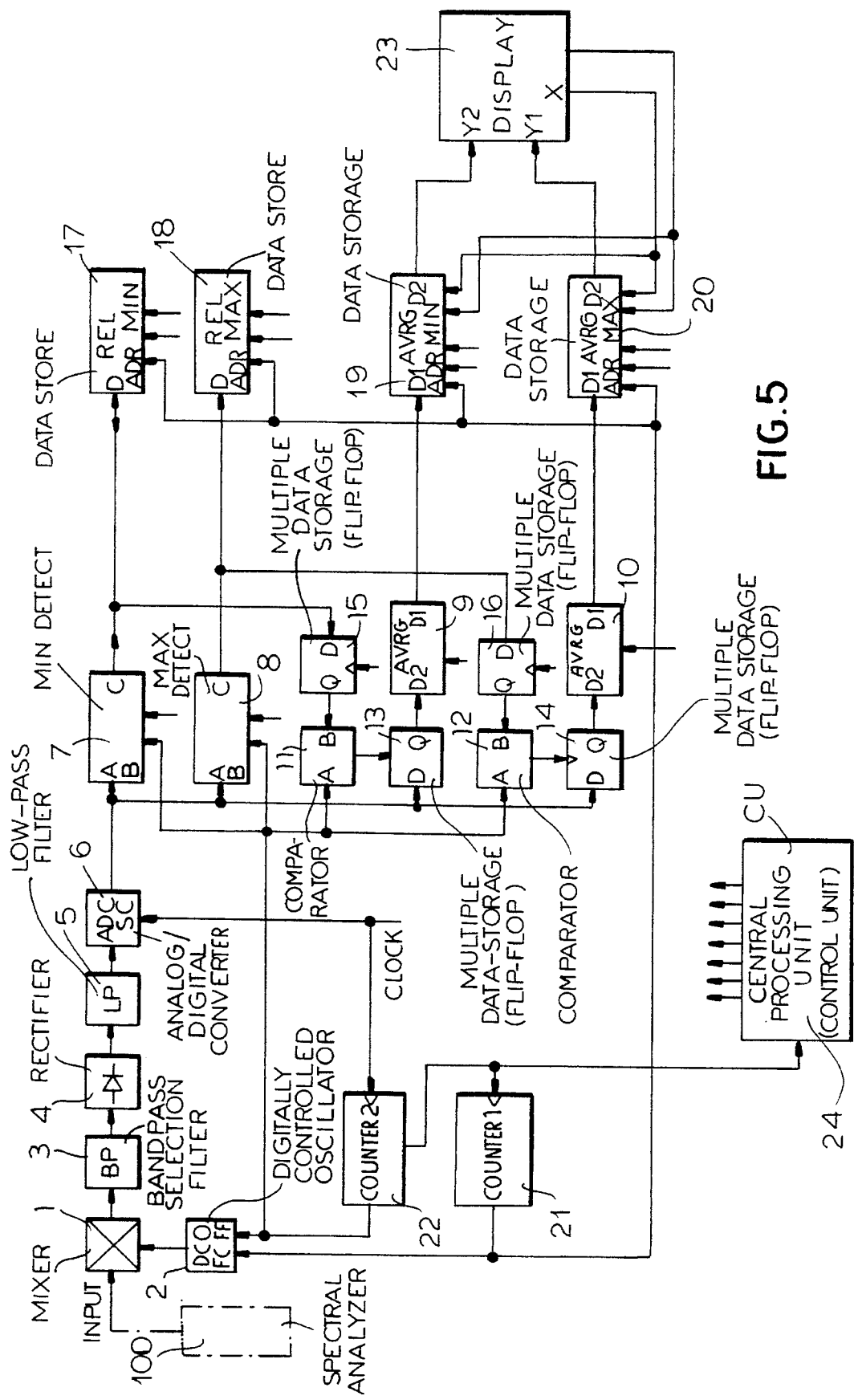
FIG. 5 is a block circuit diagram.

In FIG. 5 I have shown a spectral analyzer 100 whose output forms an input for a mixer 1 connected to a bandpass filter operating as a selection filter. The output of the selection filter passes through a rectifier 4 and a lowpass filter 5 to an analog-to-digital converter 6. A second input to the mixer derives from a digitally controlled oscillator 2 and the output of the analog-to-digital converter 6 is applied to a minimum detector 7, a maximum detector 8, comparators 11 and 12, and multiple data storage units (multiple flip-flops) 13 and 14.

The output from the minimum detector 7 is applied to the multiple data storage element or flip-flop 15 while the output from the maximum detector 8 is applied to the multiple data storage element or flip-flop 16. These two outputs are also supplied to data stores or memories 17 and 18, respectively.

The comparators 11 and 12 have outputs to the multiple data storage elements of flip-flops 13 and 14, respectively, and these supply the averagers 9 and 10 whose outputs run to the data storage units 19 and 20 for the average minimum value and the average maximum value, respectively. A display 23 is connected to outputs of the data storage units 19 and 20.

Other terminals of the minimum detector 7, the maximum detector 8, the comparator 11 and the comparator 12 are connected to the clock source, while the central processing unit 24 is connected as a control unit to the minimum detector 7, the maximum detector 8, the flip-flops 15 and 16, the averagers 9 and 10, and the data stores 17–20.

The digitally controlled oscillator 2 receives inputs from counters 21 and 22 with the count overflow or carryout CO being applied to the control unit 24.

The components 1–6 form the usual receiver unit of the spectrum analyzer 100 with digital frequency setting and digital scanning. The receiving frequency is determined by the two counters 21 and 22, the counter 21 being a coarse-stage counter and counter 22 being a fine-stage counter. For each fine stage, exactly one measured value is formed while each coarse stage represents a measuring interval. The counter state of counter 22 forms the relative address. The counter state of counter 21 determines the respective measuring interval which simultaneously represents the storage address of the four data stores 17–20. With each overflow of the counter 22, counter 21 is stepped by exactly one step and counter 22 is reset to zero. The total count process for the counter 21 corresponds to one measuring cycle.

The process during the second measuring cycle is now described. During a measuring interval, the minimum detector 7 monitors the digital values which are supplied by the analog-to-digital converter 6. At the beginning of the measuring interval, within the minimum detector 7, a data value E is set to zero and a data value D is set to the maximum value which the analog-to-digital converter 6 can supply (e.g. 255 with an eight-bit ADC).

Whenever the value at input A is smaller than the stored value D, the value D is overwritten by the value A and simultaneously the value E is overwritten by the value B (=state of the counter 22, relative address). At the end of a measuring interval (characterized by overflow of the counter 22) the value D will correspond to the smallest measured value within this interval and the value E will correspond to the relative address at which this smallest value is measured. The value E is stored in memory 17 as relative address (=AMI2). In parallel with this process at the beginning of a measuring interval, the value from the memory 17 (=relative address of the minimal value of previous measuring step AMI1) is written into the data buffer 15. During the measuring interval the comparator 11 compares this value at the input B with the actual relative address at input A. If the values are equal, the actual output value of the ADC (=MI2) is transferred to the data buffer 13. The average value calculator 9 forms the average value from the value in data buffer 13 and the value in data storage 19 (=MI1) and writes this new average value (=MI2$_{av}$) in the data storage 19.

In the components 8, 18, 14, 10, 12, 16 and 20 described above, the same process is carried out for the maximum value. The operations are controlled by the control unit 24 with the overflow from counter 22 beginning the control cycle anew.

The data stores 19 and 20 can be constituted as dual port RAMs. A display unit 23 can display the data independently of these processes with the X position of the graphic display representing the storage address and the value of the data at the particular address being represented by the Y position. The contents of the two memories 19 and 20 can be displayed as separate curves or can be combined if desired by a combining function.

I claim:

1. A method of operating a spectral analyzer having measured values representing amplitude as a function of frequency of a frequency spectrum, comprising the steps of:
   (a) analyzing a signal with a measuring instrument outputting in a series of measurement runs respective measured values of amplitude as a function of frequency over corresponding measurement intervals within a measuring range;
   (b) subdividing each of said measurement intervals into a given number of partial intervals with respective positions along the respective measurement interval;
   (c) selecting, based upon a predetermined criterium, a first value (MI1) at a given first of said positions of a first of said runs, and selecting, based upon said criterium, a second value (MA1) at a given second of said positions of said first of said runs;
   (d) selecting, based upon said criterium, another first value (MI2) at said given first of said positions of a second of said runs, and selecting, based upon said criterium, a second value (MA2) at said given second of said positions of said second of said runs;
   (e) averaging said first values to obtain a first mean value (MI2av) and averaging said second values to obtain a second mean value (MA2av);
   (f) averaging said first mean value and said second mean value with first and second values of said measuring interval of at least one run subsequent to said second run and selected from the measured values thereof based upon said criterium to generate averaged value results; and
   (g) displaying said results as a compressed and averaged analyzed spectrum.

2. The method defined in claim 1 wherein said predetermined criterium is that said first value represents a minimum of the measured values in each measuring interval and said second value represents a maximum of the measured values in each measuring interval.

3. The method defined in claim 1, further comprising the step of storing each value to be averaged with a subsequently obtained value in a memory at an address determined by the respective one of said positions.

4. The method defined in claim 1 wherein the position for the selection of the first value within a measuring interval is determined by the position of the minimum value within the same measuring interval in the preceding measuring run and that the position for the selection of the second value within a measuring interval is determined by the position of the maximum value within the same measuring interval during the preceding measuring run.

5. The method defined in claim 1 wherein only during the first measuring run are the positions for the determination of the first measured value and the second measured value not predetermined within a measuring interval and the minimum value is selected as the first measured value and the maximum value within the said measuring interval of the first measuring interval as the second measured value.

6. The method defined in claim 1 wherein the measuring intervals are subdivided into several partial intervals and for each partial interval is precisely determined a measured value and that the position of a measured value within a measuring interval is established through the number of the particular partial interview in conjunction with the quantity of partial intervals within the particular measuring interval.

7. The method defined in claim 1 wherein all the measuring intervals are subdivided into the same quantity of partial intervals and for each partial interval precisely one measured value is determined and that the position of a measured value within a measuring interval is only established by the number of the particular partial interval.

8. The method defined in claim 1 wherein precisely one measured value is associated with each partial interval within a measuring interval and is determined from several individual measurements.

9. A spectral analyzer comprising:
   a measuring instrument analyzing a frequency spectrum in a series of measurement runs and producing respective measured values of amplitude as a function of frequency over corresponding measurement intervals within a measuring range;
   means connected to said instrument and receiving said measured values for subdividing each of said measurement intervals into a given number of partial intervals with respective positions along the respective measurement interval;
   selecting means, connected to said means for subdividing, for selecting, based upon a predetermined criterium, a first value (MI1) at a given first of said positions of a first of said runs, and selecting, based upon said criterium, a second value (MA1) at a given second of said positions of said first of said runs, and for selecting, based upon said criterium, another first value (MI2) at said given first of said positions of a second of said runs, and selecting, based upon said criterium, a second value (MA2) at said given second of said positions of said second of said runs;

first averaging means connected to said selecting means averaging said first values to obtain a first mean value (MI2av) and averaging said second values to obtain a second mean value (MA2av);

second averaging means connected to said first averaging means for averaging said first mean value and said second mean value with first and second values of said measuring interval of at least one run subsequent to said second run and selected from the measured values thereof based upon said criterium to generate averaged value results; and a display connected to said second averaging means for displaying said results as a compressed and averaged analyzed spectrum.

10. The spectral analyzer defined in claim 9, further comprising means for storing each value to be averaged with a subsequently obtained value in a memory at an address determined by the respective one of said positions.

* * * * *